(12) United States Patent
Meng (10) Patent No.: US 12,385,960 B2
(45) Date of Patent: Aug. 12, 2025

(54) APPARATUS, SYSTEM, AND METHOD FOR DETERMINING A LOAD COIL VALUE FOR A LOAD COIL CONNECTED TO AN ANTENNA

(71) Applicant: Toyota Motor Engineering & Manufacturing North America, Inc., Plano, TX (US)

(72) Inventor: Ming Michael Meng, Novi, MI (US)

(73) Assignees: Toyota Motor Engineering & Manufacturing North America, Inc., Plano, TX (US); Toyota Jidosha Kabushiki Kaisha (JP)

( * ) Notice: Subject to any disclaimer, the term of this patent is extended or adjusted under 35 U.S.C. 154(b) by 195 days.

(21) Appl. No.: 18/242,452

(22) Filed: Sep. 5, 2023

(65) Prior Publication Data
US 2025/0076356 A1 Mar. 6, 2025

(51) Int. Cl.
G01R 29/08 (2006.01)
(52) U.S. Cl.
CPC ..... G01R 29/0878 (2013.01); G01R 29/0892 (2013.01)
(58) Field of Classification Search
CPC ..................... G01R 29/0878; G01R 29/0892
See application file for complete search history.

(56) References Cited

U.S. PATENT DOCUMENTS

| | | |
|---|---|---|
| 3,971,031 A | 7/1976 | Burke |
| 4,003,056 A | 1/1977 | Davis |
| 6,417,811 B1 | 7/2002 | Adrian |
| 6,452,504 B1 | 9/2002 | Seal |
| 6,608,597 B1 | 8/2003 | Hadzoglou et al. |
| 8,917,818 B2 | 12/2014 | Rozendaal |

FOREIGN PATENT DOCUMENTS

CN 211604174 U * 9/2020

OTHER PUBLICATIONS

Walmart, The Cimple CO-OTA TV Antenna Signal Strength Meter Kit with LED Display and Coaxial Cable, https://www.walmart.com/ip/THE-CIMPLE-CO-OTA-TV-Antenna-Signal-Strength-Meter-Kit-with-LED-Display-and-Coaxial-Cable/923027301?wmlspartner=wlpa&selectedSellerId=2399, 2023.
Amazon, Antenna Analyzer, HF+VHF+UHF Antenna Analyzer SWR Antenna Meter Tester Impedance Analyze, https://www.amazon.com/Antenna-Analyzer-Meter-Tester-Impedance/dp/B07KZ88MFV, Apr. 12, 2021.

* cited by examiner

Primary Examiner — Henry Luong
(74) Attorney, Agent, or Firm — Snell & Wilmer LLP (57) ABSTRACT

Apparatuses, systems, and methods for determining a load coil value for a load coil connected to an antenna. The system may include at least one adjustable inductive coil. The at least one adjustable inductive coil may have a plurality of turns. The at least one adjustable inductive coil may be connected to the antenna. The system may include an actuator. The actuator may be connected to the at least one adjustable inductive coil and may be configured to adjust at least one characteristic of the at least one adjustable inductive coil. The system may further include a user interface connected to the actuator and configured to control the actuator to adjust the at least one characteristic of the at least one adjustable inductive coil.

20 Claims, 4 Drawing Sheets

APPARATUS, SYSTEM, AND METHOD FOR DETERMINING A LOAD COIL VALUE FOR A LOAD COIL CONNECTED TO AN ANTENNA

BACKGROUND

Field

The present disclosure relates to apparatuses, systems, and methods for determining a load coil value for a load coil connected to an antenna.

Description of the Related Art

A load coil is an inductive coil of wire that may be added to an electric circuit to increase inductance. The load coil may be used with, e.g., a vehicle glass antenna (i.e., an antenna disposed on a vehicle glass—e.g., on a rear window on a vehicle) to improve the reception of radio signals. A conventional vehicle (e.g., a passenger vehicle such as a car, a pickup truck, a sport utility vehicle (SUV), or the like) may have a lot of electrical noise from various components such as, e.g., an engine, an alternator, a defogger, spark plugs, etc. The electrical noise can interfere with the reception of the radio signals by the vehicle glass antenna and make them weak or distorted, resulting in poor reception. The load coil can contribute to filtering out the electrical noise while allowing the desired radio signals to pass through. A desired value of the load coil to be added to, e.g., the vehicle glass antenna may vary based on a plurality of design requirements and other requirements of a vehicle radio system, depending on a variety of factors such as, e.g., physical dimensions of the vehicle glass antenna, a desired resonant frequency, various characteristics of surrounding objects of the vehicle, etc.

Traditionally, the method to determine an appropriate load coil value and an appropriate location, position, and/or orientation of the load coil can involve repeated calculation and testing (e.g., including measurement of various parameters using conventional measuring equipment such as an oscilloscope, a signal analyzer, or the like, calculation of a plurality of theoretical load coil values based on the measurement of the various parameters related to each potential location of the load coil, installation of the load coils with the calculated theoretical load coil values at various potential locations, confirmation of output radio signal related parameters such as signal strength, Signal to Noise Ratio (SNR), or the like, etc.) of each test vehicle until the radio signal reception meets one or more given standards (e.g., of an OEM (Original Equipment Manufacturer)). The repetition of the required calculation and/or testing (e.g., also in consideration of one or more other factors such as, e.g., resistance, capacitance, and the physical layout of the vehicle glass antenna of such antenna circuitry) can make this a tedious and costly process.

Accordingly, there is a need for apparatuses, systems, and methods to efficiently determine a load coil value for a load coil connected to an antenna.

SUMMARY

Described herein is a system for determining a load coil value for a load coil connected to an antenna. The system may include at least one adjustable inductive coil. The at least one adjustable inductive coil may have a plurality of turns. The at least one adjustable inductive coil may be connected to the antenna. The system may also include an actuator. The actuator may be connected to the at least one adjustable inductive coil. The actuator may be configured to adjust at least one characteristic of the at least one adjustable inductive coil. The system may further include a user interface. The user interface may be connected to the actuator. The user interface may be configured to control the actuator to adjust the at least one characteristic of the at least one adjustable inductive coil.

Also described is an apparatus for determining a load coil value for a load coil connected to an antenna. The apparatus may include at least one adjustable inductive coil. The at least one adjustable inductive coil may have a plurality of turns. The at least one adjustable inductive coil may be connected to the antenna. The apparatus may also include an actuator. The actuator may be connected to the at least one adjustable inductive coil. The actuator may be configured to adjust at least one characteristic of the at least one adjustable inductive coil. The apparatus may further include a user interface. The user interface may be connected to the actuator. The user interface may be configured to control the actuator to adjust the at least one characteristic of the at least one adjustable inductive coil.

Moreover, also described is a method for determining a load coil value for a load coil connected to an antenna disposed on a vehicle. The method may include setting a test apparatus positioned on or within the vehicle to a first setting via an actuator based on a user input received via a user interface connected to the actuator. The test apparatus may include at least one adjustable inductive coil. The at least one adjustable inductive coil may have a plurality of turns. The at least one adjustable inductive coil may be connected to the antenna. The actuator may be connected to the at least one adjustable inductive coil. The actuator may be configured to adjust at least one characteristic of the at least one adjustable inductive coil. The method may also include determining signal reception data corresponding to a level of reception of radio signals via the antenna connected to the test apparatus set to the first setting. The method may further include repeating adjusting the setting of the test apparatus and determining the signal reception data corresponding to the level of reception of the radio signals via the antenna connected to the test apparatus set to the adjusted setting until the signal reception data satisfies a predetermined threshold. Moreover, the method may include determining the load coil value related to the test apparatus set to the adjusted setting when the signal reception data satisfies the predetermined threshold.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

The present disclosure describes apparatuses, systems, and methods for determining a load coil value for a load coil connected to an antenna or an antenna system. The apparatuses, systems, and methods described herein provide many benefits and advantages including minimizing or reducing the amount of time required to find an appropriate load coil value as well as an appropriate location, position, and/or orientation of the load coil connected to the antenna system such as that of a vehicle glass antenna, e.g., for a test vehicle used in the design and/or the testing process for a production vehicle.

As described herein, the load coil can be used, e.g., with the vehicle glass antenna to suppress electrical noise. The apparatuses, systems, and methods described herein can minimize or reduce the amount of resource required to find the appropriate load coil value (e.g., inductance) for the load coil to minimize or reduce the electrical noise which may vary from vehicle to vehicle for various vehicles each having its unique set of surrounding conditions including, e.g., a neighboring defogger pattern, a particular vehicle glass antenna pattern, power cable routing, antenna cable routing, one or more surrounding parts, and/or the like causing electromagnetic interference (EMI) noise of given intensity and frequency.

The apparatuses, systems, and methods described herein can be used by, e.g., engineers and/or designers of such vehicles to determine the appropriate load coil value and/or the appropriate location, position, and/or orientation of the load coil connected to an antenna (e.g., the vehicle glass antenna) in vehicle development—that is, the load coil value and/or the location, position, and/or orientation of the load coil that satisfy given threshold(s) for received radio signals related to, e.g., signal strength, Signal to Noise Ratio (SNR), frequency response, harmonic distortion, adjacent channel interference, error rate, antenna matching, etc. that allow a radio system to provide clear and consistent reception of the radio signals under a variety of real-world conditions.

The apparatuses, systems, and methods described herein can provide a highly improved method to find a load coil value that enables radio signals received by an antenna to meet given standards (e.g., OEM standards) quickly and efficiently—firstly, the apparatuses, systems, and methods described herein may include a testing device that has an adjustable load coil of which engineers or designers can change the load coil value easily by using a user interface such as a knob or a screwdriver; and secondly, the test device may be equipped with either a connector including, e.g., a magnet or a flexible bolt which make it easy to determine a desired location, position, and/or orientation that enables the received radio signals to meet the given standards. The desired load coil value and the desired location, position, and/or orientation of the load coil can be determined quickly by using these methods which make the process more efficient and cost-effective by reducing or eliminating the need for repeated calculations, tests, installation and removal of load coils of various values, etc. The apparatuses, systems, and methods described herein can reduce the length of time used for finding the appropriate load coil value and the appropriate location, position, and/or orientation of the load coil (e.g., from several days to several hours).

Furthermore, the apparatuses, systems, and methods described herein can store measurement data in a local memory and/or a server to enable an efficient management of the measurement data to enable a cost-effective determination of the appropriate load coil value and the appropriate location, position, and/or orientation of the load coil. The stored measurement data (e.g., inductance measurement data and position data) may be used by engineers or designers to identify or design appropriate components having desired characteristics (including, e.g., the load coil having the appropriate or desired load coil value as well as location, position, and/or orientation) and package the components in appropriate locations, etc.

Figure 1:
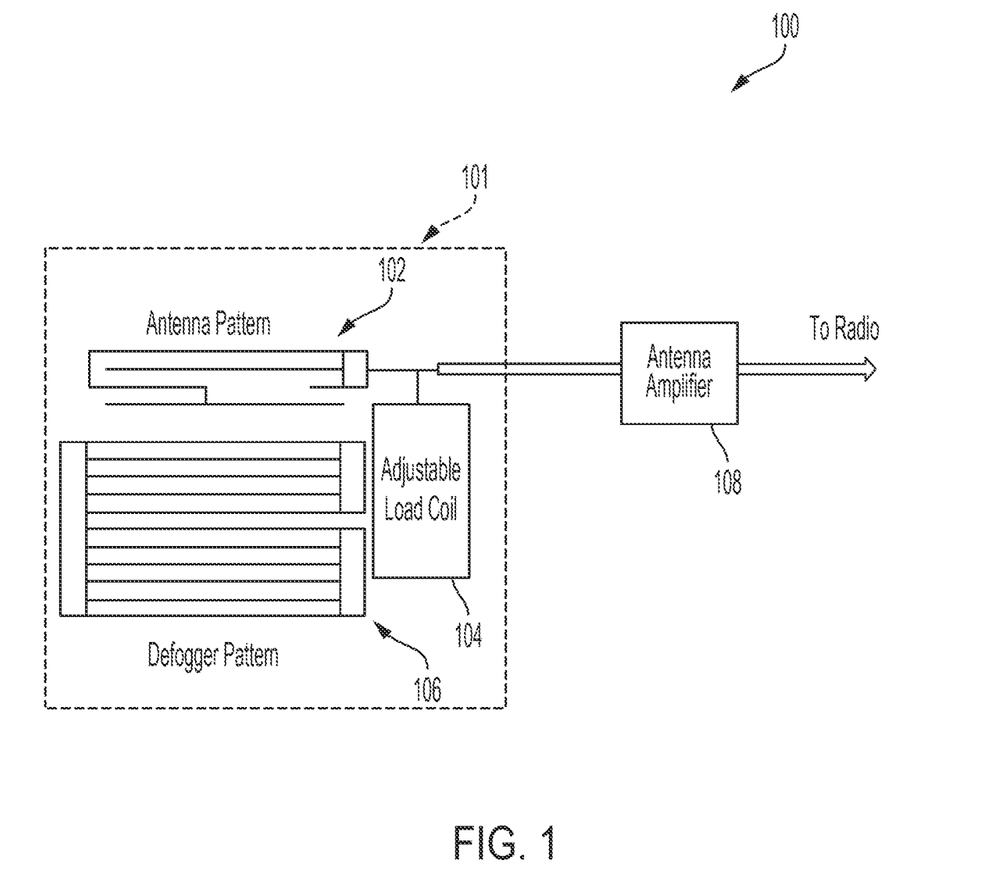
FIG. 1 is a block diagram illustrating a system for determining a load coil value for a load coil connected to an antenna according to an embodiment of the present invention.

Turning to FIG. 1, a block diagram illustrating a system 100 for determining a load coil value for a load coil connected to an antenna is shown. The system 100 may include an antenna 102 and an adjustable load coil 104. In various embodiments, the antenna 102 may be, e.g., a vehicle glass antenna on a vehicle window 101 (e.g., a rear window on a vehicle) and have a predetermined pattern of wiring. The adjustable load coil 104 may include an inductive coil of wire (i.e., an adjustable inductive coil) that may be adjustable via a user interface configured to adjust one or more characteristics or parameters associated with the adjustable load coil 104. The characteristic(s) or parameter(s) of the adjustable load coil 104 that may be modified include, e.g., a number of turns, a coil area, a coil length, and/or the like that may change the inductance of the adjustable load coil 104. The antenna 102 and/or the adjustable load coil 104 may be disposed on the vehicle window 101, and the vehicle window 101 may have a known area (which may also be referred to herein as a "real estate"—referring to the available physical space or area for integrating or packaging various parts, components, and systems).

The vehicle window 101 or any real estate over which the antenna 102 and/or the adjustable load coil 104 may be disposed may include one or more other components 106 positioned within a given vicinity of the antenna 102, the adjustable load coil 104, and/or the vehicle window 101. For example, the one or more other components 106 may include one or more components that can cause EMI to radio signals to be received via the antenna 102 and may include, e.g., one or more of a defogger having a predetermined pattern of wiring, power cable routing, antenna cable routing, etc. The one or more other components 106 may generate one or more electromagnetic fields surrounding the one or more other components 106 as would be apparent to one of ordinary skill in the art which may cause the EMI for the antenna 102.

In various embodiments, the antenna 102 may be connected to one or more additional components including, e.g., an antenna amplifier 108 which may be connected to a radio system on the vehicle. The antenna amplifier 108 may amplify the radio signals received via the antenna 102 before the amplified radio signals are received and processed by the radio system on the vehicle.

Figure 2A:
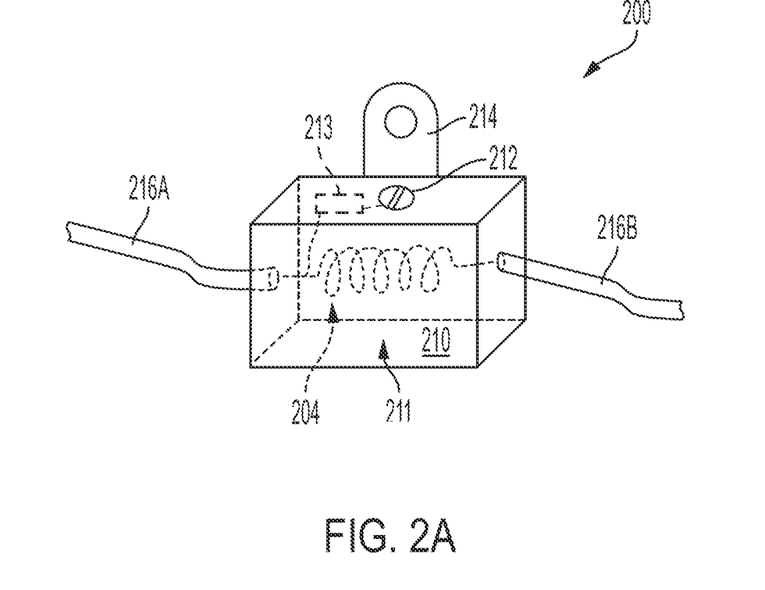
FIG. 2A is an illustration of an apparatus for determining a load coil value for a load coil connected to an antenna according to an embodiment of the present invention.

Turning now to FIG. 2A, an apparatus 200 for determining a load coil value for a load coil connected to an antenna is shown. The apparatus 200 may be a test apparatus and include an enclosure 210, a user interface 212, a connector 214, a first wiring 216A, and a second wiring 216B.

The enclosure 210 may have a cavity 211 in which an adjustable load coil 204 (e.g., similar to the adjustable load coil 104 shown in and described herein with respect to FIG. 1) may be disposed. The enclosure 210 may be made of any material that does not cause a meaningful level of EMI. The enclosure 210 may allow the adjustable load coil 204 to be moved around and manipulated without, e.g., being damaged.

The user interface 212 may provide an interface for a user (or, in some embodiments, a controller device configured to mechanically and automatically control the user interface 212) to manipulate the adjustable load coil 204 to change its load coil value. For example, the user interface 212 may include a knob, a part including a groove or the like which may be rotated via, e.g., a device or a tool such as a screwdriver, or the like. The user interface 212 may be connected to or include an actuator 213 configured to adjust the adjustable load coil 204 to change or modify one or more of its characteristics such as, e.g., its number of turns, coil area, coil length, and/or the like based on a user input from the user interface 212 (e.g., a number/degree of the rotation of the knob or the like). The modification of the adjustable load coil 204 including, e.g., the adjusted number of turns, coil area, coil length, or the like based on the control by the actuator 213 may change the level of impact that the adjustable load coil 204 has on the connected antenna (e.g., similar to the antenna 102 shown in and described herein with respect to FIG. 1) based on the load coil value (e.g., inductance) corresponding to the adjusted number of turns, coil area, coil length, or the like.

The varied number of turns, coil area, coil length, or the like may result in the varied level of inductance of the adjustable load coil 204. The level of impact on minimizing or reducing the EMI from other component(s) in the vicinity of the connected antenna may be varied based on the resulting load coil value (i.e., inductance), and the process of modifying or varying at least one characteristic of the adjustable load coil 204 may be repeated using the user interface 212 until an optimal level of inductance from a given number of turns, coil area, coil length, and/or the like that enables a threshold level or quality of the radio signal reception by the connected antenna (i.e., meeting one or more predetermined standards related to signal strength, SNR, or the like) is found. Such effort can allow the testing/designing process of a vehicle (specifically the load coil connected to, e.g., a vehicle glass antenna—in some embodiments, in consideration of other components relating to, e.g., resistance, capacitance, and/or the physical layout of the vehicle glass antenna) to be more efficient and cost-effective because the engineer(s) and/or the designer(s) do not need to take up as much resource for as long (e.g., an oscilloscope, a signal analyzer, or the like) or use a multitude of parts such as inductors of varying inductance levels which, in some cases, may not be re-used and may be disposed of after the testing/design process, nor do they need to spend as much time in continuously connecting and disconnecting the multitude of parts such as the inductors to and from the vehicle glass antenna while continuously running calculations for theoretical load coil values, confirming various parameters, etc.

The connector 214 may be or include a magnet or a flexible bolt which makes it easy to determine a desired location, position, and/or orientation of the adjustable load coil 204 that enables the reception of radio signals via the connected antenna to meet one or more predetermined standards. That is, not only may the load coil value of the adjustable load coil 204 be adjusted via the user interface 212, the location, position, and/or orientation of the adjustable load coil 204 (i.e., that of the enclosure 210) may be freely adjusted on, e.g., a vehicle window (e.g., similar to the vehicle window 101 shown in and described herein with respect to FIG. 1) or on any real estate on the vehicle such as, e.g., an outer surface of the vehicle by the enclosure 210 being moved and being removably and temporarily fixed onto a given location on the vehicle window (in a given orientation, for example) via the connector 214. For example, the magnet or the flexible bolt on the connector 214 may allow the enclosure 210 to be removably attached to any part of the available real estate for each test iteration. The varied location, position, and/or orientation of the adjustable load coil 204 may allow the optimal location, position, and/or orientation of the adjustable load coil 204 (for minimizing or reducing the EMI) to be determined. The capability of easily (e.g., by allowing the apparatus 200 to be re-used for more than one test iteration) being moved and removably fixed/removed via the connector 214 (used to removably attach and remove the apparatus 200 to and from any portion of the vehicle window, for example) can allow the optimal location, position, and/or orientation of the adjustable load coil 204 to be found while minimizing or reducing waste or cost.

The first wiring 216A and the second wiring 216B may be used to connect the adjustable load coil 204 to the antenna and may each include flexible wiring and a connector (e.g., a wire clamp connector, an alligator clip, or the like) to enable an easier attachment and removal of the apparatus 200 onto and from any portion of the wiring connected to the antenna or the antenna system such as to allow the adjustable load coil 204 to be moved and connected to the antenna at any available location on the real estate of the vehicle window (e.g., forming a parallel connection, or a series connection in some embodiments, between the adjustable load coil 204 and the antenna). This allows the testing/design process to be more efficient and/or more cost-effective because the wiring of the connected antenna does not need to be continuously cut and re-connected each time the apparatus 200 (i.e., the adjustable load coil 204) is moved-significantly reducing the amount of resources expended for this effort (e.g., cost, time, etc.).

Figure 3:
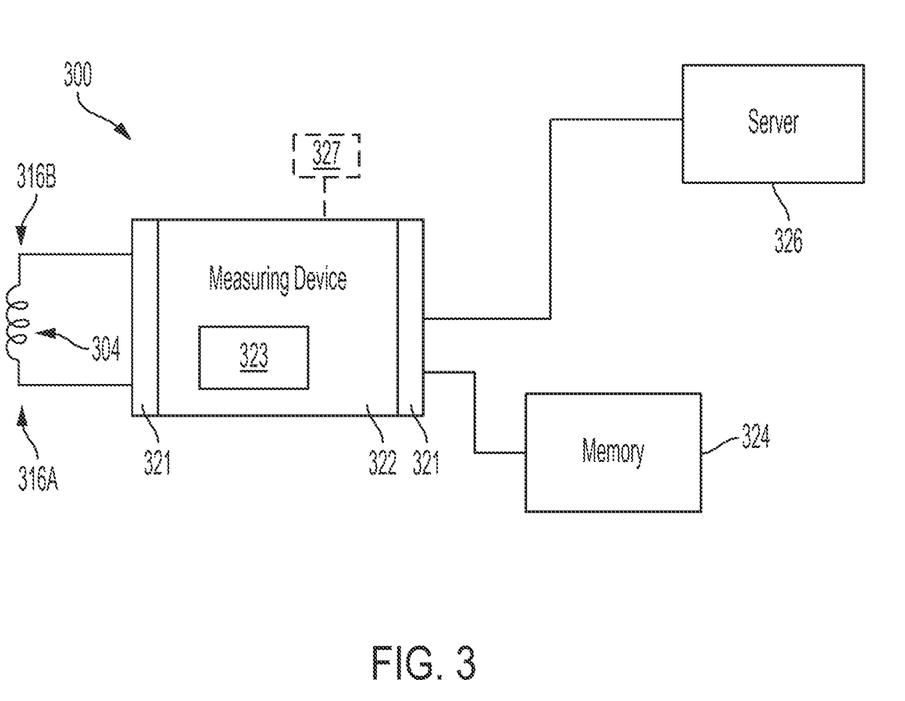
FIG. 3 is a block diagram illustrating a system for determining a load coil value for a load coil connected to an antenna according to an embodiment of the present invention.

In some embodiments, the apparatus 200 or the enclosure 210 may include one or more wheels or other similar components as well as a controller or a connection to a controller (e.g., a wireless connection) that can allow the apparatus 200 to be moved autonomously (or, e.g., based on one or more control signals from the controller which may be controlled by an operator) to various locations, positions, and/or orientations (i.e., relative to the antenna and/or one or more other components), e.g., based on location, position, and/or orientation data that may be collected and stored on a memory (e.g., a local memory or a remote memory—see, e.g., memory 324 or server 326 shown in and described herein with respect to FIG. 3) for various types of vehicles through various test iterations.

Figure 2B:
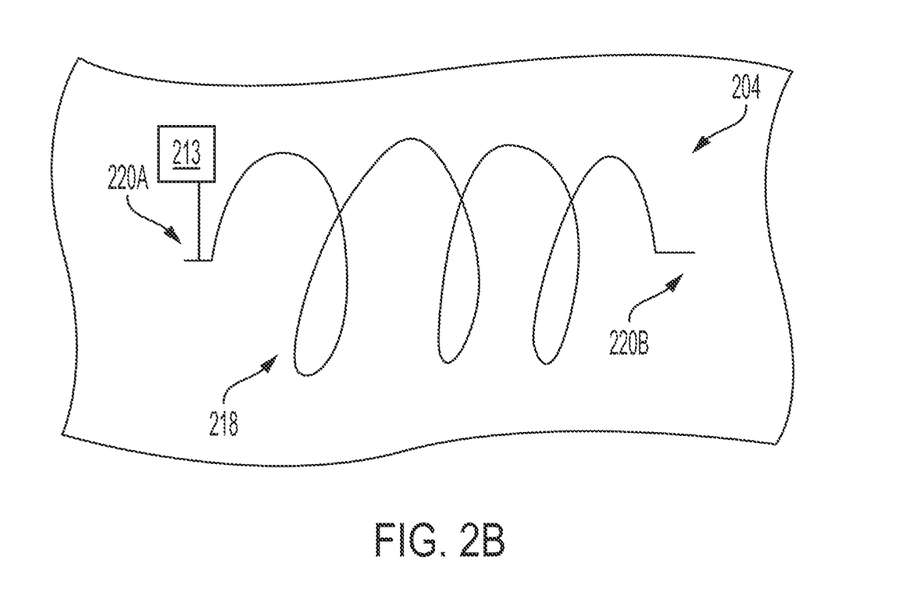
FIG. 2B is an illustration of a portion of an apparatus for determining a load coil value for a load coil connected to an antenna according to an embodiment of the present invention.

Turning now to FIG. 2B, the adjustable load coil 204 is shown. In various embodiments, the adjustable load coil 204 may be disposed within an enclosure such as, e.g., the enclosure 210 shown in and described herein with respect to FIG. 2A. The adjustable load coil 204 may have a first end 220A and a second end 220B. For example, the first end 220A and the second end 220B may connect to, respectively, the first wiring 216A and the second wiring 216B connected to the enclosure 210 shown in and described herein with respect to FIG. 2A. The adjustable load coil 204 may have a preset number of turns 218. The adjustable load coil 204 may have a predetermined default or initial load coil value which may be based on one or more considerations including, e.g., a previous version of the vehicle of the same model, another model of a vehicle known to have a similar real estate (i.e., size, shape, or the like) and/or surrounding conditions such as surrounding components of an antenna (e.g., a vehicle glass antenna). The adjustable load coil 204 may be connected to the actuator 213 which may be included in or may be part of, e.g., the user interface 212 shown in and described herein with respect to FIG. 2A. The actuator 213 may manipulate the adjustable load coil 204 such that, e.g., the number of coils, the coil area, the coil length, or the like may be adjusted. For example, the actuator 213 may actuate or rotate an adjustable core disposed within the adjustable load coil 204 to adjust the load coil value (i.e., inductance).

Referring now to FIG. 3, a system 300 for determining a load coil value of a load coil connected to an antenna is shown. The system 300 may include an adjustable load coil 304 which can be connected to a measuring device 322 via a first end 316A and a second end 316B of the adjustable load coil 304. For example, the measuring device 322 may be a device configured to measure an inductance over a connected device (e.g., the adjustable load coil 304) such as, e.g., an LCR meter or the like. The measuring device 322 may have one or more I/O (Input/Output) interfaces 321 and an output device 323. At least one of the I/O interfaces 321 may, e.g., receive the first end 316A and the second end 316B of the adjustable load coil 304 to connect the first end 316A and the second end 316B to the measuring device 322 (e.g., forming a closed electric circuit that allows the measurement of the inductance of the adjustable coil 304). As the testing described herein is performed by varying the load coil value of the adjustable load coil 304, the changing load coil value (i.e., inductance) may be measured by the measuring device 322 to identify the load coil value that contributes to the minimization or the reduction of the EMI on the connected antenna by one or more other components in a given vicinity of the antenna and/or the adjustable load coil 304 as described herein. The quality of the radio signal reception by the connected antenna may be monitored concurrently to find the optimal load coil value that allows the highest quality or level of radio signal reception by the connected antenna (or at least the quality or level that satisfies one or more predetermined standards).

In some embodiments, the system 300 may include a memory 324 connected to the measuring device 322. The measuring device 322 may include or may be connected to a processor that causes data including the measured load coil values to be stored on the memory 324. The memory 324 may store a plurality of instructions to be executed by the processor and may include one or more of a RAM (Random Access Memory) or other volatile or non-volatile memory. The memory 324 may be a non-transitory memory or a data storage device, such as a hard disk drive, a solid-state disk drive, a hybrid disk drive, or other appropriate data storage, and may further store machine-readable instructions, which may be loaded and executed by the processor.

In some embodiments, the system 300 (e.g., the measuring device 322) may include a network access device such as a transceiver (e.g., as part of or connected to at least one of the I/O interfaces 321) configured to enable a communication (e.g., a wireless communication) with a server 326. The measuring device 322 may include or may be connected to a processor that causes the measurement data to be transmitted to the server 326 such that the measurement data may be stored on the server 326. In some embodiments, the server 326 may be connected to one or more other measuring devices similar to the measuring device 322 and store measurement data of additional vehicle(s) from, e.g., the other measuring devices. The additional vehicle(s) may have various configurations of the antenna pattern, the defogger pattern, and/or the presence of one or more other components contributing to the EMI.

The measurement data stored on the memory 324 and/or the server 326 may be stored, grouped, and/or categorized based on grouping or categorization data corresponding to various groups or categories of the measurement data. For example, the grouping or categorization data may include information relating to a type of vehicle, an area of the real estate on, e.g., a vehicle glass/window, an antenna pattern, a defogger pattern, and/or the like. The memory 324 and/or the server 326 may also include location, position, and/or orientation data (which may also be referred to herein as position data) corresponding to, e.g., the location, position, and/or orientation of the adjustable load coil 304 when the load coil value measurements are taken.

The output device 323 on the measuring device 322 may include, e.g., a display or an audio device such as a speaker configured to output data or information. The output data may include, e.g., measurement information from the measuring device 322. In some embodiments, the measuring device 322 (e.g., its processor) may access the data stored on the memory 324 and/or the server 326, receive input (via an input device) regarding a vehicle under test (e.g., related to the parameters described herein such as, e.g., a defogger pattern, presence of one or more other parts, etc.), and output information indicative of a recommended initial load coil value based on a comparison of the input data and the stored data retrieved or accessed from the memory 324 and/or the server 326 (e.g., initial or default load coil value(s) corresponding to certain grouping or categorization).

In some embodiments, a robot 327 connected to the measuring device 322 may automatically move the location, position, and/or orientation of the adjustable load coil 304 (or, e.g., an enclosure having the adjustable load coil 304 therein—similar to the enclosure 210 shown in and described herein with respect to FIG. 2A) and/or manipulate the adjustable load coil 304 to change the load coil value of the adjustable load coil 304 (e.g., via a user interface similar to the user interface 212 shown in and described herein with respect to FIG. 2A). In some embodiments, the robot 327 may include an end effector configured to engage with the user interface to manipulate the adjustable load coil 304.

As an aside, each of the components described herein may be or include an apparatus, a device, a system, a module (e.g., hardware or software), a circuitry, or the like configured to perform the disclosed operation(s).

Figure 4:
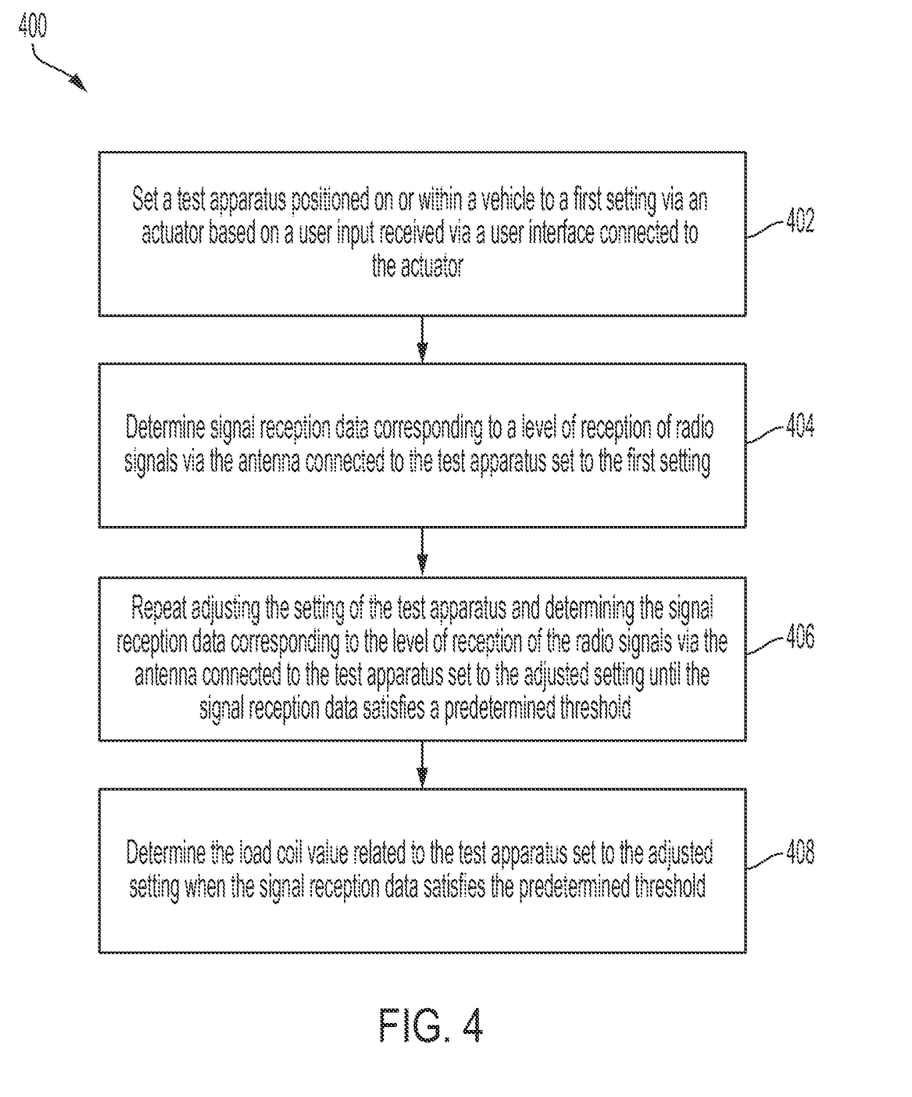
FIG. 4 is a flowchart of a method for determining a load coil value for a load coil connected to an antenna according to an embodiment of the present invention.

FIG. 4 is a flowchart of a method 400 for determining a load coil value for a load coil connected to an antenna (e.g., disposed on a vehicle). The method 400, at least in part, may be implemented via a plurality of instructions (e.g., a software program) stored on a memory (similar to the memory 324 shown in and described herein with respect to FIG. 3) and accessed and processed by a processor to perform the various steps of the method 400. In some embodiments, the method 400, at least in part, may be performed by an operator such as, e.g., an engineer or a designer testing a test vehicle for antenna performance. In some embodiments, the method 400, at least in part, may be performed automatically by a robot or a device (e.g., similar to the measuring device 322 and/or the robot 327 connected to the measuring device 322 shown in and described herein with respect to FIG. 3).

The method 400 may include setting a test apparatus positioned on or within a vehicle to a first setting (e.g., a first number of coils resulting in a first load coil value such as a first inductance) via an actuator based on a user input received via a user interface connected to the actuator (see step 402). The test apparatus may include at least one adjustable inductive coil having a plurality of turns and connected to an antenna. The actuator may be connected to the at least one adjustable inductive coil and configured to adjust at least one characteristic of the at least one adjustable inductive coil.

The method 400 may also include determining signal reception data corresponding to a level of reception of radio signals via the antenna connected to the test apparatus set to the first setting (see step 404).

In step 406, the method 400 may include repeating adjusting the setting (e.g., the number of coils resulting in adjusted load coil value such as adjusted inductance) of the test apparatus and determining the signal reception data corresponding to the level of reception of the radio signals via the antenna connected to the test apparatus set to the adjusted setting until the signal reception data satisfies a predetermined threshold (e.g., relating to signal strength, SNR, etc.).

In step 408, the method 400 may include determining the load coil value related to the test apparatus set to the adjusted setting when the signal reception data satisfies the predetermined threshold.

In some embodiments, the method 400 may further include adjusting a position of the test apparatus on or within the vehicle. The method 400 may further include adjusting a location, a position, or an orientation of the test apparatus relative to the antenna and/or one or more other components on or within the vehicle. Moreover, in some embodiments, the method 400 may also include repeating adjusting the location, the position, and/or the orientation of the test apparatus on or within the vehicle and determining the signal reception data corresponding to the level of reception of the radio signals via the antenna connected to the test apparatus disposed at the adjusted location, position, and/or orientation on or within the vehicle until the signal reception data satisfies the predetermined threshold.

Where used throughout the specification and the claims, "at least one of A or B" includes "A" only, "B" only, or "A and B." Exemplary embodiments of the apparatuses, the systems, and the methods described herein have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments (e.g., including a singular element where multiple elements are described and/or multiple elements where a singular element is described, etc.) that reasonably fall within the scope of the advancement to the art hereby contributed, and that that scope shall not be restricted, except in light of the appended claims and their equivalents.

What is claimed is:

1. A system for determining a load coil value for a load coil connected to an antenna, the system comprising:
   at least one adjustable inductive coil having a plurality of turns and connected to the antenna;
   an actuator connected to the at least one adjustable inductive coil and configured to adjust at least one characteristic of the at least one adjustable inductive coil; and
   a user interface connected to the actuator and configured to control the actuator to adjust the at least one characteristic of the at least one adjustable inductive coil.

2. The system of claim 1, wherein the antenna is a vehicle glass antenna disposed on a glass on a vehicle.

3. The system of claim 1, wherein the at least one adjustable inductive coil is connected to the antenna in parallel.

4. The system of claim 1, wherein the at least one characteristic of the at least one adjustable inductive coil is a number of turns of the at least one adjustable inductive coil.

5. The system of claim 1, further comprising an enclosure having a cavity configured to receive at least the at least one adjustable inductive coil.

6. The system of claim 1, wherein the user interface is further configured to control the actuator to adjust the at least one characteristic of the at least one adjustable inductive coil based on a control manipulation received via the user interface.

7. The system of claim 1, further comprising a connector configured to removably attach to a portion on a vehicle within a predetermined vicinity of the antenna.

8. The system of claim 1, wherein the adjustment of the at least one characteristic of the at least one adjustable inductive coil modifies the load coil value for the load coil connected to the antenna.

9. An apparatus for determining a load coil value for a load coil connected to an antenna, the apparatus comprising:
   at least one adjustable inductive coil having a plurality of turns and connected to the antenna;
   an actuator connected to the at least one adjustable inductive coil and configured to adjust at least one characteristic of the at least one adjustable inductive coil; and
   a user interface connected to the actuator and configured to control the actuator to adjust the at least one characteristic of the at least one adjustable inductive coil.

10. The apparatus of claim 9, further comprising an enclosure having a cavity configured to receive at least the at least one adjustable inductive coil.

11. The apparatus of claim 9, wherein the user interface includes a portion configured to be manipulated by an operator or a robot to control the actuator to adjust the at least one characteristic of the at least one adjustable inductive coil.

12. The apparatus of claim 11, wherein the portion on the user interface is controlled manually by the operator using a tool.

13. The apparatus of claim 11, wherein the portion on the user interface is controlled automatically by the robot based on one or more instructions executed by a controller connected to the robot.

14. The apparatus of claim 13, wherein the robot includes an end effector configured to engage with the portion on the user interface to control the actuator to adjust the at least one characteristic of the at least one adjustable inductive coil.

15. A method for determining a load coil value for a load coil connected to an antenna disposed on a vehicle, the method comprising:
   setting a test apparatus positioned on or within the vehicle to a first setting via an actuator based on a user input received via a user interface connected to the actuator, the test apparatus including at least one adjustable inductive coil having a plurality of turns and connected to the antenna, the actuator being connected to the at least one adjustable inductive coil and configured to adjust at least one characteristic of the at least one adjustable inductive coil;

determining signal reception data corresponding to a level of reception of radio signals via the antenna connected to the test apparatus set to the first setting;

repeating adjusting the setting of the test apparatus and determining the signal reception data corresponding to the level of reception of the radio signals via the antenna connected to the test apparatus set to the adjusted setting until the signal reception data satisfies a predetermined threshold; and determining the load coil value related to the test apparatus set to the adjusted setting when the signal reception data satisfies the predetermined threshold.

16. The method of claim 15, further comprising:

adjusting at least one of a location, a position, or an orientation of the test apparatus on or within the vehicle; and repeating adjusting the at least one of the location, the position, or the orientation of the test apparatus on or within the vehicle and determining the signal reception data corresponding to the level of reception of the radio signals via the antenna connected to the test apparatus disposed at the adjusted at least one of the location, the position, or the orientation on or within the vehicle until the signal reception data satisfies the predetermined threshold.

17. The method of claim 15, further comprising placing the test apparatus at a first location, position, or orientation on or within the vehicle.

18. The method of claim 17, wherein placing the test apparatus at the first location, position, or orientation on or within the vehicle is based on receiving location, position, or orientation data from a memory connected to the test apparatus.

19. The method of claim 15, wherein the first setting is based on measurement data stored on a memory connected to the test apparatus.

20. The method of claim 15, further comprising storing data corresponding to the first setting and the adjusted setting on a memory connected to the test apparatus.

* * * * *